United States Patent [19]

Scharr et al.

[11] Patent Number: 4,609,936
[45] Date of Patent: Sep. 2, 1986

[54] SEMICONDUCTOR CHIP WITH DIRECT-BONDED EXTERNAL LEADFRAME

[75] Inventors: Thomas A. Scharr, Tempe; Vern H. Winchell, II, Phoenix, both of Ariz.

[73] Assignee: Motorola, Inc., Schaumburg, Ill.

[21] Appl. No.: 76,878

[22] Filed: Sep. 19, 1979

[51] Int. Cl.[4] .................... H01L 23/48; H01L 29/40; H01L 29/44
[52] U.S. Cl. ........................ 357/68; 357/65; 357/70; 357/71
[58] Field of Search .............. 357/70, 68, 71

[56] References Cited

U.S. PATENT DOCUMENTS

| | | | |
|---|---|---|---|
| 3,566,207 | 2/1971 | Adams | 357/70 |
| 3,636,619 | 1/1972 | Welty et al. | 357/68 |
| 3,676,922 | 7/1972 | Cook | 357/70 |
| 3,773,628 | 11/1973 | Misawa et al. | 357/70 |
| 3,893,156 | 7/1975 | Riseman | 357/70 |
| 3,918,032 | 11/1975 | Nicolaides | 357/71 |
| 3,946,426 | 3/1976 | Sanders | 357/68 |
| 4,000,842 | 1/1977 | Burns | 357/71 |
| 4,028,722 | 6/1977 | Helda | 357/70 |
| 4,045,863 | 9/1977 | Mitterhummer | 357/70 |
| 4,063,993 | 12/1977 | Burns | 357/70 |
| 4,087,314 | 5/1978 | George et al. | 357/68 |
| 4,109,096 | 8/1978 | Dehaine | 357/70 |
| 4,138,691 | 2/1979 | Bonkohara et al. | 357/70 |
| 4,151,545 | 4/1979 | Schnepf et al. | 357/71 |
| 4,164,461 | 8/1979 | Schilling | 357/71 |
| 4,188,636 | 2/1980 | Sato et al. | 357/71 |
| 4,201,999 | 5/1980 | Howard et al. | 357/71 |
| 4,206,472 | 6/1980 | Chu et al. | 357/71 |

*Primary Examiner*—Andrew J. James
*Attorney, Agent, or Firm*—Robert M. Handy

[57] ABSTRACT

Structure and process for providing a hard metallic leadframe directly bonded to a semiconductor chip without the necessity for solder or soft intermediate leadframes. The structure provides a strong bond at the semiconductor chip with the possibility for multiple simultaneous lead attachment of a leadframe having sufficient strength to serve as the external leads. The bonded structure may be conventionally encapsulated in a plastic or ceramic package, or may be glassed to provide a minimum volume hermetic chip.

16 Claims, 2 Drawing Figures

SEMICONDUCTOR CHIP WITH DIRECT-BONDED EXTERNAL LEADFRAME

RELATED APPLICATIONS

Winchell, Scharr and Clark, Ser. No. 06,076,879, entitled "Elevated Edge-Protected Bonding Pads", filed on even date herewith.

BACKGROUND AND SUMMARY

Semiconductor devices have traditionally been packaged by connecting the semiconductor chip to the external package leads by a multiplicity of fine wires individually bonded to the semiconductor chip. Many devices are still fabricated in this fashion.

For several years, attempts have been made to eliminate the one-at-a-time wire bonding step by connecting a substantially flat leadframe comprising multiple fine leads directly to the semiconductor chip in a gang-bonding operation providing essentially simultaneous multiple-lead attachment to reduce costs and increase reliability. Representative of this approach is U.S. Pat. No. 3,698,074 hereby incorporated by reference. In the approach contemplated by the reference, a soft internal leadframe, such as aluminum or copper, is bonded both to the semiconductor chip and to a harder, thicker external leadframe suitable for making connections to the encapsulated device.

Variations on the reference approach have been proposed in order to increase economy and reliability by eliminating the multiple leadframes. For example, U.S. Pat. No. 3,922,712 describes a hard frame configuration which is partially solder clad for connection to relatively thick bump bonding areas on the semiconductor chip. In addition to the temperature limitations introduced by the solder technique (suitable chiefly for subsequent plastic encapsulation) the provisions of thick bumps on the semiconductor chips increases the cost and precludes the use of the bumped chip with other bonding techniques where one chip type is to be used in a number of different packages.

It is an object of the present invention to provide a leaded semiconductor chip assembly comprising hard leads bonded directly to the semiconductor chip metallization without the use of solder.

It is a further object of the present invention to minimize the complexity of the lead-attach metallurgy.

It is yet another object of this invention to provide a leaded semiconductor chip assembly where the leads are suitable for direct connection to an external circuit.

It is yet another object of this invention to provide a leaded semiconductor chip assembly wherein all the bonds are formed substantially simultaneously.

It is yet a further object of this invention to provide a leaded semiconductor chip assembly which may be glass-encapsulated for mechanical and electrical stability.

In the devices of the present invention, a multiplicity of hard leads are bonded directly to relatively thin bonding areas on the semiconductor chip. When the bonded assembly is subsequently encapsulated, such as by glass or plastic, the hard leads serve as elements for external connections to the device. Bonding may be facilitated by the provision of relatively thinner hard lead portions at their inner ends where they are bonded to the semiconductor chip.

Structurally, the elements of the present invention include a substantially aluminum bonding area supported by a thin pedestal of a harder metal on the semiconductor chip; together with a substantially flat hard leadframe of a coefficient of expansion similar to the semiconductor, which frame has been annealed prior to bonding in order to reduce its tensile strength and facilitate the bonding operation. Bonding is further facilitated by the provision of ultrasonic energy in order to achieve a bond between the hard metal lead and the substantially aluminum bonding pad which materials are not amenable to conventional thermo/compression welding. The bonds are post-annealed in order to relieve bonding stresses and increase pull strength.

By the cooperative combination of the foregoing structural and process elements, a practical semiconductor device having a direct bonded unitary hard lead is achieved.

THE DRAWINGS

DETAILED DESCRIPTION

Figure 1:
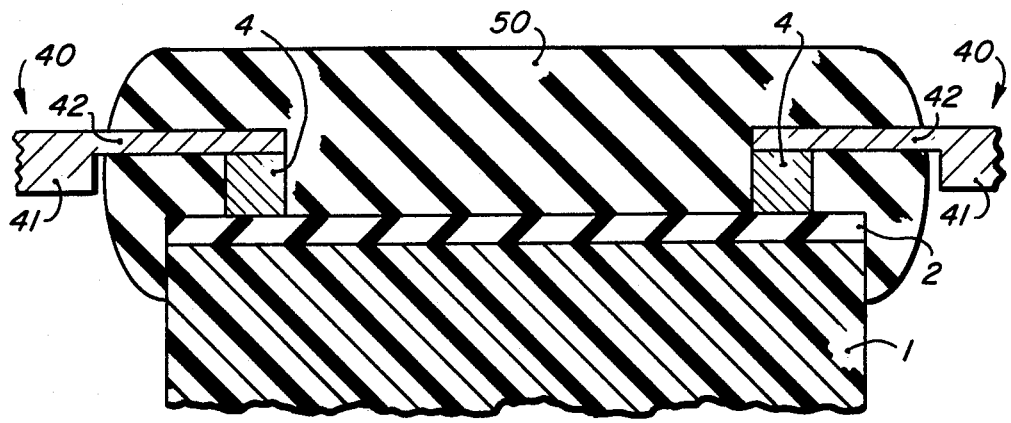
FIG. 1 is a cross-sectional view of the semiconductor device with direct bonded unitary hard leads.

FIG. 1 illustrates the major features of this invention in cross-section. In this FIGURE, element 1 is the semiconductor substrate, and regions 4 are bonding pedestals suitable for direct bonding of the hard metallic leads 40. The bonding pedestals 4 may either make direct contact with the semiconductor substrate or lie over an insulator 2 on the substrate and be connected with semiconductor circuit elements by means of intra-circuit metallization, as exemplified in FIG. 2.

Figure 2:
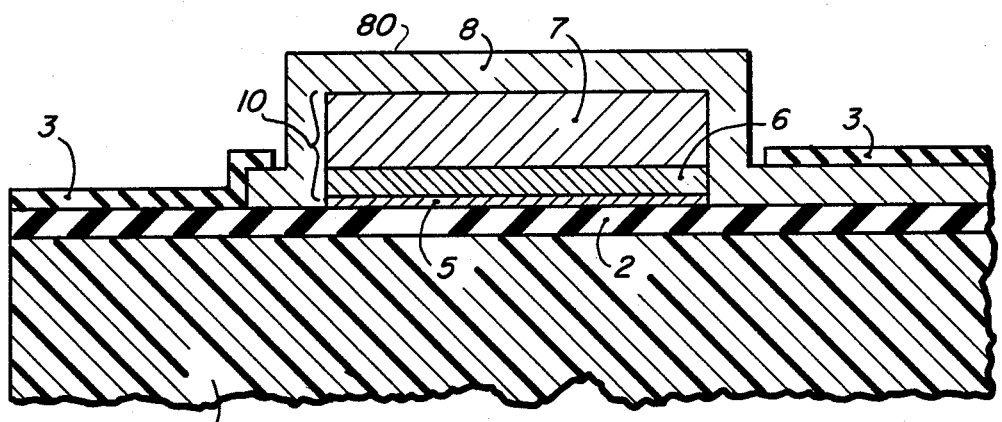
FIG. 2 is a detailed cross-sectional view of a bonding pad on a semiconductor chip suitable for directly bonded hard leads.

FIG. 2 shows the details of a bonding pedestal 4 which have been omitted from FIG. 1. Again, 1 is the semiconductor substrate, and 5–8 are metallic layers forming the bonding pedestal 4 described in more detail hereinafter. Layer 2 is an optional insulator required when the bonding area must be electrically isolated from the substrate. Layer 8 comprises aluminum or a substantially aluminum alloy and may lead off to the right to form the intra-circuit metallization where the semiconductor device is for example an integrated circuit. Because of the fine patterning required in layer 8 where it comprises the intra-circuit metallization as well as the upper portion of bonding area 4, it is desirable to protect layer 8 by an insulating layer 3 over the intra-circuit metallization as well as the periphery of the bonding area 4. However, insulator 3 should lie entirely below the elevated portion of layer 8 at the bonding pad situs so as not to interfere with the bonding of the substantially flat lead 40. If the support element 10 for the elevated portion of layer 8 (formed in this embodiment by layers 5, 6 and 7) is thicker than insulating layer 3, this requirement is met. Additionally, in this invention, support element 10 must comprise a sufficient thickness of a metal with a hardness greater than aluminum (e.g. layer 6) in order to be able to effect a bond to a hard metal lead and to avoid cracking of the semiconductor substrate or the insulator underlying the bonding pedestal 4.

The detailed description of the present invention begins with the formation of the elevated bonding pedestal 4. Here a patterned hard metal layer 6, comprising e.g. approximately 5,000 Å of a film consisting of 10% titanium and 90% tungsten, is formed over the substrate 1 and underlies an approximately 20,000 Å aluminum layer 7 in order to form the support element 10 for the elevated bonding area 80 comprising an aluminum or aluminum alloy layer 8 approximately 10,000 Å thick. A thin layer of aluminum 5 may be used below the titanium-tungsten layer in order to promote adhesion to the insulating layer 2. Insulating layer 2 need not be present where electrical connection directly to the substrate (e.g. a diffused portion) is desired. Insulating layer 3 is patterned to completely cover the periphery of the lower level of layer 8 in the bonding pedestal area. That is, the aperture in insulating layer 3 is larger than the dimensions of support element 10 in order that the periphery of the bonding pedestal 4 is completely passivated by an insulating layer lower than the level of bonding area 80. In this embodiment, the substantially flat hard lead 40 is bonded directly to the aluminum or aluminum alloy layer 8 without damage to the underlying substrate 2 or semiconductor substrate. Metal layer 8 is completely covered at its periphery by insulating layer 3, thus minimizing the potential for electrochemical attack. In this configuration, all metal not covered by an insulating layer is monometallic in the sense that it comprises a metal of substantially uniform composition, thus obviating the possibility for galvanic corrosion during processing or in non-hermetic encapsulation.

Proceeding now to the details of the leads and the bonding method, leads 41 in the preferred embodiment are formed from Alloy 42, a commercially available 42% nickel, balance iron, alloy having approximately the same coefficient of thermal expansion as the silicon substrate 1. A substantially flat leadframe comprising a plurality of inwardly extending leads supported by an integral external frame is formed by etching a ten mil thick sheet of Alloy 42 to form a plurality of finger-like configurations 40, with the ends of the fingers corresponding to the bonding areas 4 in FIG. 1. Each finger is typically about 3 mils wide. Further etching may be used to reduce the thickness at the ends of the fingers 42 to about 2 mils in order to facilitate the bonding. The balance 41 of each finger 40 has a thickness of about 10 mils in order to be sufficiently rigid for use as an external leadframe.

The thus formed leadframe was gang-bonded simultaneously to a number of bonding areas 4 by the application of 5 watts of ultrasonic energy at 2000 grams for 100 mS to a bonding tool having a 4 mil wide bonding wedge to form approximately 8 mils$^2$ bonds between the Alloy 42, fingers 40 and the substantially aluminum bonding area 4. The pull strengths of the resulting individual bonds was measured at around 4 gms average, too low to withstand subsequent assembly operations. By annealing the substantially flat Alloy 42 frame for 20 minutes in a 900° C. hydrogen atmosphere prior to bonding, and post-annealing the completed ultrasonic bonds at 330° C. for 10 minutes, individual bond pull strengths increased to about 15 gms. Thus the combination of the especially constructed pedestal, ultrasonic bonding, and annealing resulted in acceptable individual bond strengths for a hard lead frame bonded directly to substantially aluminum bonding areas. The ultrasonic bonding operation imparts a natural lift to the leads outside the bonding areas thus tending to prevent lead shorts to the semiconductor substrate until subsequent encapsulation such as by glass plastic etc. has been effected.

The bonded substrate hereinbefore described is particularly suitable for encapsulation by glass means 50 which seal the semiconductor element, impart additional strength to the bonds, and preclude lead shorts to the edge of the substrate, as shown by FIG. 1. For example, a glass-binder mixture comprising a glass with a coefficient of thermal expansion similar to silicon (and the hard leads) such as Corning 7556 and then fired above the enameling temperature of the glass, typically above 500° C. Such a procedure would be impossible with prior art die attachment schemes employing soft solder melting below the enameling temperature. Directly-bonded soft leadframes of the prior art would be unsuitable for glass encapsulation because of the potential for cracking or thermal excursions due to the mismatch of expansion coefficients.

There is thus provided by the present invention an improved contact structure for a semiconductor element wherein hard leads are bonded directly to a moderately elevated bonding area comprising substantially aluminum supported by a metallic material harder than aluminum.

Having thus described the invention by a single preferred embodiment, it will be apparent to those of skill in the art that various modifications can be made within the spirit and scope of the present invention. For example, hard leadframe materials other than Alloy 42 may be used. Specifically, other iron-nickel compositions have been found to be suitable such as 36% nickel, 64% iron. It is believed that lead materials with a tensile strength greater than 50,000 PSI can also be used provided they are heat treated above their annealing point to permit bonding. Likewise, hard metals, other than titanium-tungsten may be used to support the substantially aluminum bonding area and prevent collapse of the elevated bonding pedestal and/or damage to the underlying substrate.

We claim:
1. A leaded semiconductor chip assembly comprising:
   a semiconductor substrate including metallic lead attach pedestals comprising substantially aluminum bonding areas supported by metallic means having a hardness greater than aluminum, and
   a multiplicity of hard flat leads with direct bonds to said bonding areas.
2. The assembly of claim 1 including where said direct bonds are simultaneously-formed ultrasonic bonds.
3. The assembly of claim 1 where said leads are thinner at their extremities at said bonding areas.
4. The assembly of claim 1 further including an insulating passivating layer over a periphery of said metallic lead attach pedestal, said layer lying below the level of said bonding areas at said periphery.
5. The assembly of claim 1, further including glass means over said substrate and said direct bonds for supporting and sealing said assembly.
6. An electrical device comprising:
   a substrate including a semiconductor;
   at least one bonding pedestal, of predetermined height on said substrate and coupled to said semiconductor, and wherein said bonding pedestal has a substantially aluminum outer bonding layer forming a bonding surface;
   a metallic means harder than aluminum, underlying and supporting said bonding layer; and
   externally connectable metallic lead means, attached without use of a soft internal lead frame to said at least one bonding pedestal and having a coefficient of expansion similar to said substrate.

7. The device of claim 6 wherein said substrate is formed from a silicon single crystal.

8. The device of claim 7 wherein said metallic lead means is annealed by heating prior to being attached to said at least one bonding pedestal.

9. The device of claim 8 wherein said metallic lead means is attached to said at least one bonding pedestal ultrasonic bonding means to form a bonded region therebetween, and wherein said bonded region is subsequently annealed by heating.

10. The device of claim 9 wherein said outer bonding layer substantially conformally coats said underlying metallic means and which has a perimeter extending onto said substrate around said bonding pedestal.

11. The device of claim 10 wherein a protective encapsulant layer coats said perimeter of said outer bonding layer.

12. The device of claim 11 wherein said metallic lead means is deformed during bonding so as to avoid contact between said metallic lead means and said substrate beyond the region of said bonding pedestal.

13. The device of claim 12 wherein said metallic lead means includes nickel and iron.

14. The device of claim 13 wherein said underlying metallic means comprises titanium and tungsten.

15. The device of claim 6, 7, 8, 9, 10, 11, 12, or 13 further comprising an outer encapsulant means enclosing said bonded region, a portion of said substrate, and a portion of said metallic lead means.

16. The device of claim 15 wherein said outer encapsulant means comprises a glass.

* * * * *